United States Patent
Chen et al.

(10) Patent No.: US 12,336,324 B1
(45) Date of Patent: Jun. 17, 2025

(54) DEVICE FOR MASS TRANSFER OF MINI LIGHT-EMITTING DIODES (MINI-LEDS) BASED ON ARRAY WATER JET-BASED EJECTION

(71) Applicant: Guangdong University of Technology, Guangzhou (CN)

(72) Inventors: Yun Chen, Guangzhou (CN); Yanhui Chen, Guangzhou (CN); Li Ma, Guangzhou (CN); Pengwei Lv, Guangzhou (CN); Hao Zhang, Guangzhou (CN); Maoxiang Hou, Guangzhou (CN); Xin Chen, Guangzhou (CN)

(73) Assignee: Guangdong University of Technology, Guangzhou (CN)

( * ) Notice: Subject to any disclaimer, the term of this patent is extended or adjusted under 35 U.S.C. 154(b) by 0 days.

(21) Appl. No.: 19/063,218

(22) Filed: Feb. 25, 2025

Related U.S. Application Data

(62) Division of application No. 18/769,404, filed on Jul. 11, 2024, now Pat. No. 12,261,239.

(30) Foreign Application Priority Data

Aug. 8, 2023 (CN) .......................... 202310992493.0

(51) Int. Cl.
*H10H 20/01* (2025.01)
*H01L 21/68* (2006.01)
(Continued)

(52) U.S. Cl.
CPC ........... *H10H 20/01* (2025.01); *H01L 21/681* (2013.01); *H01L 21/6835* (2013.01); *H01L 25/0753* (2013.01)

(58) Field of Classification Search
CPC . H01L 33/005; H01L 21/681; H01L 21/6835; H01L 25/0753; H01L 21/67144; H01L 33/0093; H10H 20/01
See application file for complete search history.

(56) References Cited

U.S. PATENT DOCUMENTS

2008/0229574 A1* 9/2008 Yang ........................ H01L 25/50
29/821
2016/0064629 A1* 3/2016 Chang .................... H01L 33/56
438/28

FOREIGN PATENT DOCUMENTS

CN 107887294 A 4/2018
CN 113314453 A 8/2021
(Continued)

*Primary Examiner* — Ratisha Mehta

(57) ABSTRACT

A device for mass transfer of Mini-LEDs based on array water jet-based ejection, including a planar motion platform, a vision camera, an array water jet-type ejection unit, a Z-axis motion platform, a blue membrane, an operation platform and a transfer substrate. The vision camera and the array water jet-type ejection unit are provided on a side of the planar motion platform. The array water jet-type ejection unit includes a water jet channel and a through-hole array. The Z-axis motion platform is provided at a side of the planar motion platform near the vision camera, and is configured for placement of the blue membrane. Multiple Mini-LED chips are bonded to the blue membrane. The operation platform is spacedly provided at a side of the Z-axis motion platform away from the planar motion platform.

7 Claims, 5 Drawing Sheets

(51) Int. Cl.
*H01L 21/683* (2006.01)
*H01L 25/075* (2006.01)

(56) References Cited

FOREIGN PATENT DOCUMENTS

| | | |
|---|---|---|
| CN | 113451179 A | 9/2021 |
| CN | 114512579 A | 5/2022 |
| CN | 114512584 A | 5/2022 |
| CN | 115172538 A | 10/2022 |
| CN | 115274511 A | 11/2022 |
| EP | 3929970 A1 | 12/2021 |

\* cited by examiner

DEVICE FOR MASS TRANSFER OF MINI LIGHT-EMITTING DIODES (MINI-LEDS) BASED ON ARRAY WATER JET-BASED EJECTION

CROSS-REFERENCE TO RELATED APPLICATIONS

This application is a divisional of U.S. patent application Ser. No. 18/769,404, filed on Jul. 11, 2024, now pending, which claims the benefit of priority from Chinese Patent Application No. 202310992493.0, filed on Aug. 8, 2023. The content of the aforementioned application, including any intervening amendments thereto, is incorporated herein by reference in its entirety.

TECHNICAL FIELD

This application relates to Mini/Micro LED chip transfer and packaging technology, and more particularly to a device for mass transfer of mini light-emitting diodes (Mini-LEDs) based on array water jet-based ejection.

BACKGROUND

With the rapid development of light-emitting diode (LED) technology and the continuous improvement of luminous efficiency of LEDs, the LEDs have been increasingly popularized. The future LED chips are expected to be high-power and miniaturized, so as to enhance the luminous intensity of LED devices and place as many chips as possible within a given area. The miniaturized chip products mainly include Mini LEDs and Micro LEDs. Mini LEDs refer to LED devices with a size ranging from 50 to 200 μm, while Micro LED chips refer to LED devices with a size smaller than 50 μm. The chip miniaturization allows the loading of more LED chips onto a display panel of the same area, resulting in higher luminous intensity, faster photoelectric response, and greater color contrast performance. However, the miniaturization also poses a challenge to the transfer and packaging of chips.

The Mini/Micro LEDs transfer techniques mainly include laser transfer method, vacuum suction transfer method and mechanical pin-ejector transfer method. The laser transfer method has high requirements for materials, lasers, and environmental conditions, and thus the cost is significantly increased. Regarding the vacuum suction transfer method, it is required to independently pick up and release individual chips, resulting in poor transfer efficiency. Additionally, the involved equipment has a large space occupation due to the split-type structure. The mechanical arm has a cantilever structure, which will cause significant vibration during the transfer and packaging process, greatly limiting the precision and efficiency of the transfer and packaging. The mechanical pin-ejector transfer method has poor transfer efficiency, and the unavoidable frequent start and stop of the motion platform will exacerbate its wear and tear. Moreover, the vibration caused by start and stop will also significantly reduce the packaging precision. Moreover, the traditional pin-ejector transfer method cannot effectively eliminate the pose deviations of some chips after wafer expansion.

Therefore, there is an urgent need for a new Mini-LED chip transfer method that can effectively improve the chip transfer efficiency and precision, and can also avoid the pose deviations of Mini-LED chips during the expansion on the blue membrane.

SUMMARY

The present disclosure provides a device and method for mass transfer of Mini-LEDs based on array water jet-based ejection to improve the chip transfer efficiency and precision and eliminate the pose deviations generated in the spacing expansion of the Mini-LED chips on the blue membrane.

In a first aspect, the present disclosure provides a device for mass transfer of Mini-LEDs based on array water jet-based ejection, comprising:

a planar motion platform operating on an x-y plane;
a vision camera;
an array water jet-type ejection unit;
a Z-axis motion platform;
a blue membrane;
an operation platform; and
a transfer substrate;
wherein the vision camera and the array water jet-type ejection unit are provided on a side of the planar motion platform;
the array water jet-type ejection unit comprises a water jet channel and a through-hole array;
the Z-axis motion platform is provided at the side of the planar motion platform where the vision camera is provided, and is spaced from the planar motion platform; and the Z-axis motion platform is configured for placement of the blue membrane;
a plurality of Mini-LED chips uniformly distributed are bonded to a surface of the blue membrane;
the operation platform is spacedly provided at a side of the Z-axis motion platform away from the planar motion platform; and
the transfer substrate is fixedly provided on a side of the operation platform near the Z-axis motion platform.

The planar motion platform is mounted on a first Y-axis motion slide, and is configured to be driven to move in a Y-axis direction under the action of a first Y-axis motion mechanism. Both ends of the first Y-axis motion mechanism are each fixed on an X-axis motion slide. The first Y-axis motion mechanism is configured to be driven to move in an X-axis direction under the action of an X-axis motion mechanism. Both ends of the X-axis motion mechanism are each supported by a column. In this way, the planar motion platform and all the components mounted thereon can realize movement in the X-axis and Y-axis directions.

Both ends of the Z-axis motion platform are each fixed to a Z-axis motion slide. The Z-axis motion slide is configured to be driven by a Z-axis motion mechanism to move in a Z-axis direction, thereby driving the Z-axis motion platform to move in the Z-axis direction.

The array water jet-type ejection unit is connected to the water jet channel to control a jet water column to be ejected from an array nozzle. The array water jet-type ejection unit is mounted on the planar motion platform through a sheet metal part.

The transfer substrate is fixed on the operation platform. The operation platform is arranged on a driving slide. The driving slide is sleevedly provided on a guide rail. Both ends of the guide rail are each fixed by a guide rail fixing component. A driving assembly is provided at an end of the guide rail. Both ends of the operation platform are each fixed to a second Y-axis motion slide. The second Y-axis motion slide is configured to slide relative to a second Y-axis motion mechanism. In this way, the operation platform can realize movement in the Y-axis direction under the joint action of the guide rail, the driving assembly, the second Y-axis motion slide, the second Y-axis motion mechanism and the driving slide.

In an embodiment, the transfer substrate is a glass substrate or a printed circuit board (PCB) substrate.

In an embodiment, in a case where the transfer substrate is the glass substrate, a surface of a side of the transfer substrate near the blue membrane is provided with a double-sided adhesive tape, and in a case where the transfer substrate is the PCB substrate, the surface of the side of the transfer substrate near the blue membrane is provided with a solder paste.

In an embodiment, a spacing between adjacent through-holes in the through-hole array is a positive integer multiple of a spacing between adjacent Mini-LED chips among the plurality of Mini-LED chips.

In an embodiment, a diameter of individual through-holes in the through-hole array is less than or equal to a length of a shortest side of each of the plurality of Mini-LED chips in contact with the surface of the blue membrane.

In an embodiment, a geometric size of each of the plurality of Mini-LED chips is 50-200 μm.

In an embodiment, a thickness of the blue membrane is 70-75 μm.

In a second aspect, the present disclosure provides a method for mass transfer of Mini-LEDs based on array water jet-based ejection, comprising:
(S1) placing the blue membrane to which the plurality of Mini-LED chips are bonded to a lower surface horizontally on the Z-axis motion platform, and fixing the transfer substrate on a side of the operation platform near the blue membrane;
(S2) scanning, by the vision camera, the plurality of Mini-LED chips through the blue membrane with a certain degree of transparency to obtain pose information of the plurality of Mini-LED chips, and controlling the water jet channel to perform adjustment according to the pose information of the plurality of Mini-LED chips; identifying, by the vision camera, the blue membrane, the array water jet-type ejection unit, and a distance between the blue membrane and the transfer substrate to adjust a height of the Z-axis motion platform, a position of the planar motion platform in the X-axis and Y-axis directions, a position of the transfer substrate in the Y-axis direction and the position of the operation platform in the Y-axis direction to complete positioning of the array water jet-type ejection unit, the plurality of Mini-LED chips and the transfer substrate in an X-axis direction and a Y-axis direction;
(S3) ejecting, by the array water jet-type ejection unit, a water jet array to drive a first group of Mini-LED chips among the plurality of Mini-LED chips and the blue membrane to be peeled off to the transfer substrate; and
(S4) transferring the array water jet-type ejection unit to a position above a second group of Mini-LED chips among the plurality of Mini-LED chips through positioning of the vision camera, and repeating S3 to complete ejection of the plurality of Mini-LED chips.

Compared to the prior art, the present disclosure has the following beneficial effects.

Compared to the traditional ejection methods, the array water jet-based ejection method effectively reduces the impact on the blue membrane and Mini-LED chips, and avoids the downward pin ejection process in the mechanical pin-ejector transfer technique, allowing a higher transfer yield and an improved transfer efficiency. The arrayed ejection ensures that the Mini-LED chips of the same group have the same ejection transfer conditions, reducing the probability of pose deviations during the chip transfer compared to traditional ejection methods. Additionally, the water jet channel can be finely adjusted to address transfer errors caused by pose deviations of the chips on the blue membrane.

BRIEF DESCRIPTION OF THE DRAWINGS

The present disclosure will be described in detail below in conjunction with the accompanying drawings. Through the detailed description in conjunction with the following drawings, the above or other aspects of the present disclosure will become clearer and easier to understand.

In the figures: 1—planar motion platform, 2—vision camera, 3—Z-axis motion platform, 4—array water jet-type ejection unit; 5—blue membrane, 6—Mini-LED chip, 7—transfer substrate, 8—operation platform, 9—water jet channel, 11—first Y-axis motion slide, 12—first Y-axis motion mechanism, 13—column, 14—X-axis motion slide, 15—X-axis motion mechanism, 16—Z-axis motion slide, 17—Z-axis motion mechanism, 21—guide rail fixing component, 22—guide rail, 23—driving assembly, 24—second Y-axis motion slide, 25—second Y-axis motion mechanism, and 26—driving slide.

DETAILED DESCRIPTION OF EMBODIMENTS

The embodiments of the present disclosure will be described in detail below with reference to the accompanying drawings.

The specific embodiments/examples described herein are illustrative and exemplary, and should not be construed as limiting the scope of the disclosure. Based on the embodiments described herein, those skilled in the art can also arrive at other technical solutions. Any obvious substitutions and modifications made to these technical solutions shall fall within the scope of the present disclosure defined by the appended claims.

Embodiment 1

Figure 1:
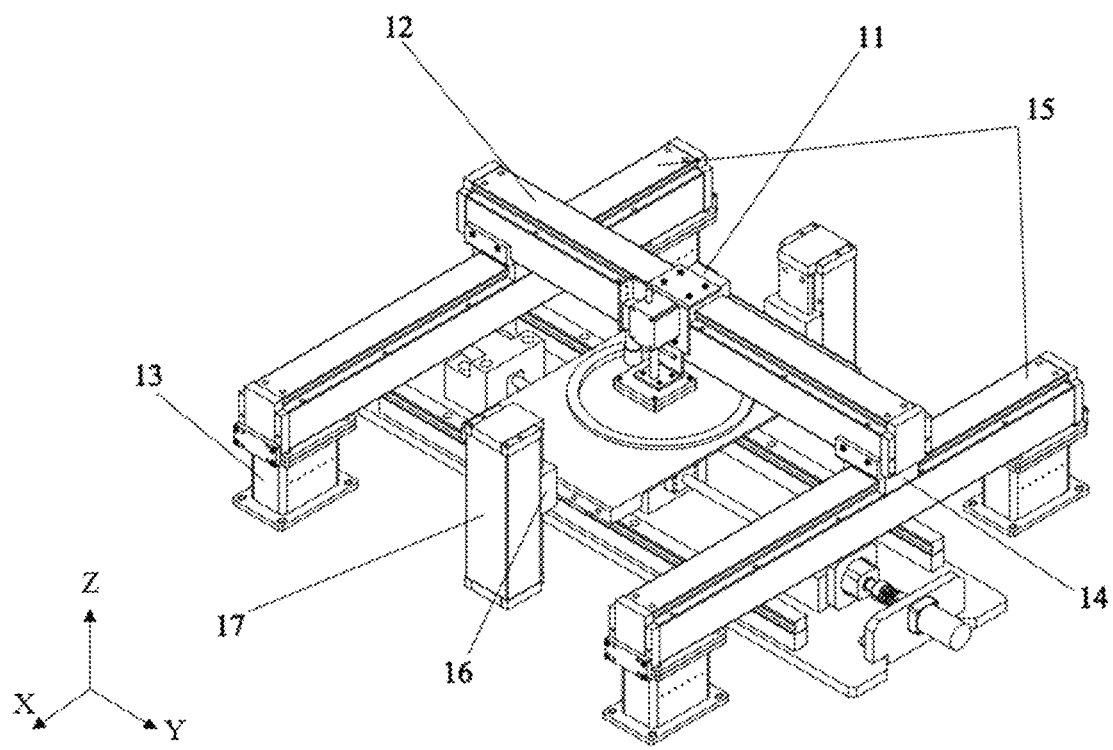
FIG. 1 is a structural diagram of a device for mass transfer of Mini-LEDs based on array water jet-based ejection according to an embodiment of the present disclosure.
Figure 2:
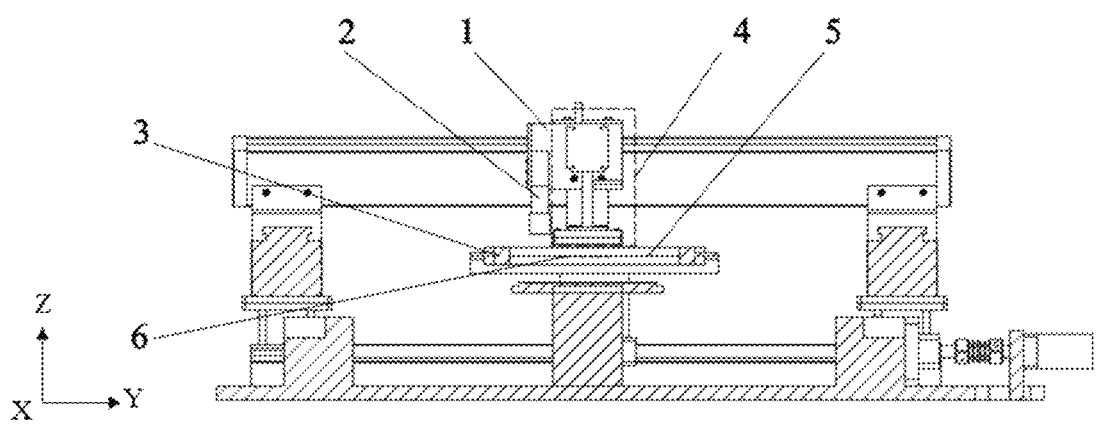
FIG. 2 is a cross-sectional view of the device according to an embodiment of the present disclosure.
Figure 3:
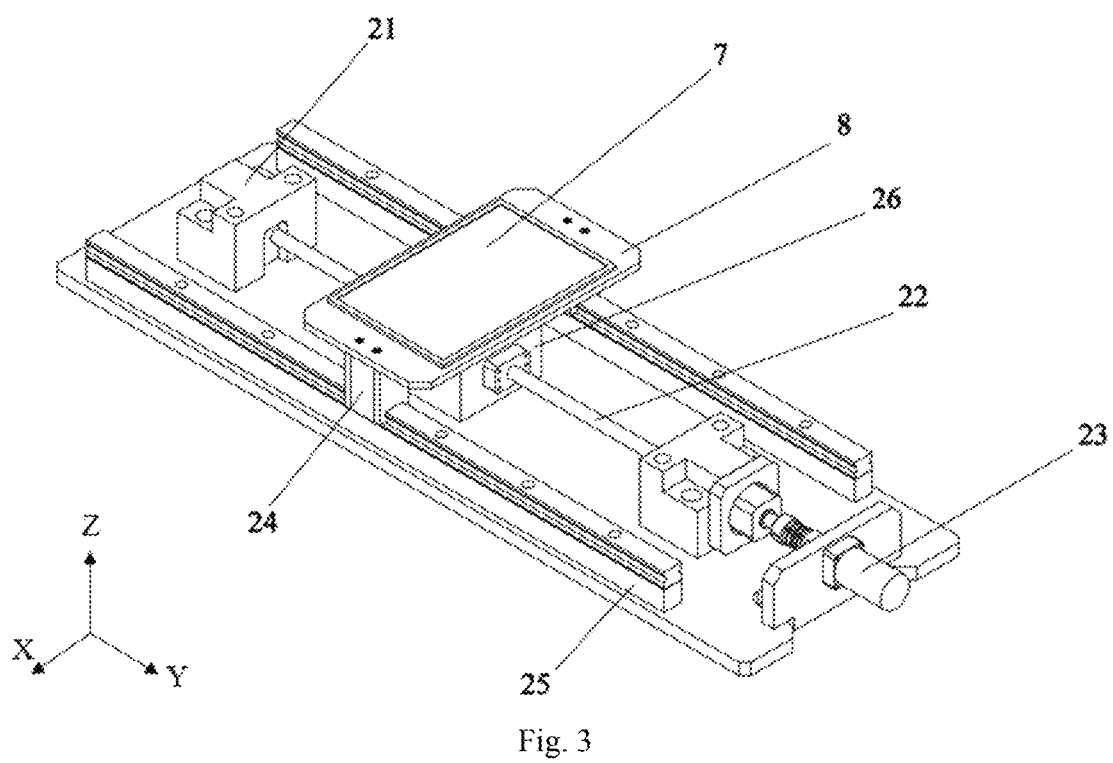
FIG. 3 is a structural diagram of a transfer substrate motion structure of the device according to an embodiment of the present disclosure.
Figure 4:
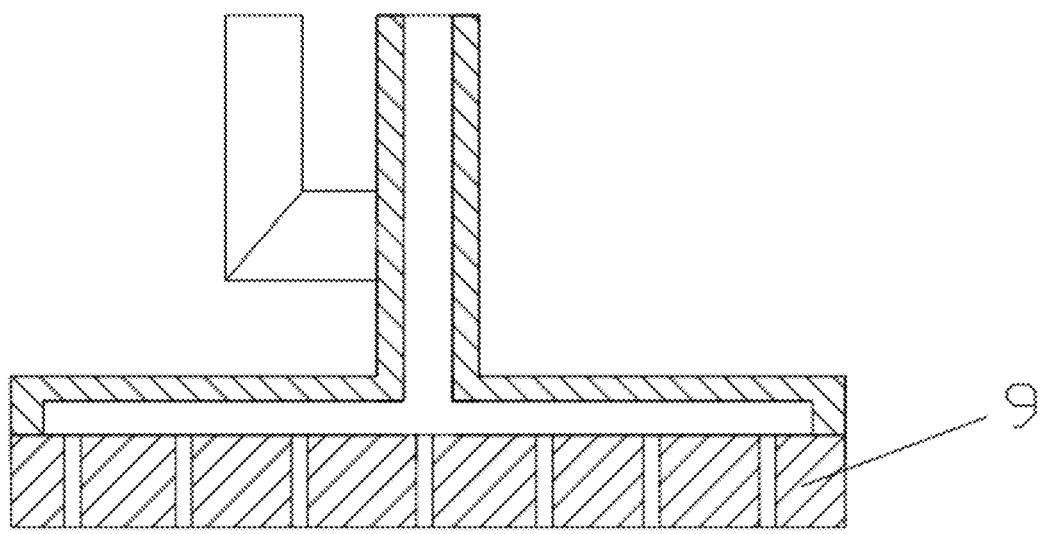
FIG. 4 is a cross-sectional view of a water jet channel of the device according to an embodiment of the present disclosure.

FIG. 1 is a schematic diagram of a device for mass transfer of Mini-LEDs based on array water jet-based ejection, FIG. 2 is a cross-sectional view of the device, FIG. 3 schematically shows a transfer substrate motion structure of the device, and FIG. 4 schematically shows a water jet channel of the device. Specifically, the device provided herein for mass transfer of the Mini-LEDs includes a planar motion platform 1 operating on an X-Y plane, a vision camera 2, an array water jet-type ejection unit 4, a Z-axis motion platform 3, a blue membrane 5, a transfer substrate 7 and an operation platform 8.

The vision camera 2 and the array water jet-type ejection unit 4 are provided on a side of the planar motion platform 1, the array water jet-type ejection unit 4 includes a water jet channel 9 and a through-hole array (not marked in the figures), the Z-axis motion platform 3 is provided at the side of the planar motion platform 1 where the vision camera is provided, and is spaced from the planar motion platform, the Z-axis motion platform 3 is configured for placement of the blue membrane 5, a plurality of Mini-LED chips 6 uniformly distributed are bonded to the surface of the blue membrane 5, the operation platform 8 is spacedly provided at a side of the Z-axis motion platform 3 away from the planar motion platform 1 and the transfer substrate 7 is fixedly provided on a side of the operation platform 8 near the Z-axis motion platform 3, the planar motion platform is configured to operate on an X-Y plane that is perpendicular to the Z-axis.

The planar motion platform 1 is mounted on a first Y-axis motion slide 11, and is configured to be driven to move in a Y-axis direction under the action of a first Y-axis motion mechanism 12. Both ends of the first Y-axis motion mechanism 12 are each fixed on an X-axis motion slide 14. The first Y-axis motion mechanism 12 is configured to be driven to move in an X-axis direction under the action of an X-axis motion mechanism 15. Both ends of the X-axis motion mechanism 15 are each supported by a column 13. In this way, the planar motion platform 1 and all the components mounted thereon can realize movement in the X-axis and Y-axis directions.

Both ends of the Z-axis motion platform 3 are each fixed to a Z-axis motion slide 16. The Z-axis motion slide 16 is configured to be driven by a Z-axis motion mechanism 17 to move in a Z-axis direction, thereby driving the Z-axis motion platform 3 to move in the Z-axis direction.

The array water jet-type ejection unit 4 is connected to the water jet channel 9 to control a jet water column to be ejected from an array nozzle. The array water jet-type ejection unit 4 is mounted on the planar motion platform 1 through a sheet metal part.

The transfer substrate 7 is fixed on the operation platform 8. The operation platform 8 is arranged on a driving slide 26. The driving slide 26 is sleevedly provided on a guide rail 22. Both ends of the guide rail 22 are each fixed by a guide rail fixing component 21. A driving assembly 23 is provided at one of the two ends of the guide rail 22. Both ends of the operation platform 8 are each fixed to a second Y-axis motion slide 24. The second Y-axis motion slide 24 is configured to slide relative to a second Y-axis motion mechanism 25. In this way, the operation platform 8 can realize movement in the Y-axis direction under the joint action of the guide rail 22, the driving assembly 23, the second Y-axis motion slide 24, the second Y-axis motion mechanism 25 and the driving slide 26.

In an embodiment of the present disclosure, the transfer substrate 7 is a glass substrate or a printed circuit board (PCB) substrate.

In an embodiment of the present disclosure, in a case that the transfer substrate is the glass substrate, the surface of a side of the transfer substrate near the blue membrane 5 is provided with a double-sided adhesive tape, and in a case that the transfer substrate is the PCB substrate, the surface of the side of the transfer substrate near the blue membrane 5 is provided with a solder paste. This configuration achieves that when the water jet array impacts and drives the blue membrane 5 and the Mini-LED chips 6 below the blue membrane 5 to fall to be in contact with the transfer substrate 7, such that the Mini-LED chips 6 are detached from the blue membrane 5 due to the adhesive forces.

In an embodiment, the spacing between adjacent through-holes in the through-hole array on the array water jet-type ejection unit 4 is a positive integer multiple of the spacing between adjacent Mini-LED chips among the plurality of Mini-LED chips 6 on the blue membrane 5. This configuration facilitates the precise alignment of the water jet array ejected by the array water jet-type ejection unit 4 with the blue membrane 5 and the plurality of Mini-LED chips 6, effectively improving the transfer efficiency and accuracy of the Mini-LED chips.

In an embodiment, the diameter of the individual through-holes in the through-hole array on the array water jet-type ejection unit 4 is less than or equal to the length of the shortest side of each of the plurality of Mini-LED chips 6 in contact with the surface of the blue membrane 5. This configuration effectively improves the efficiency and precision of chip transfer.

In an embodiment, the geometric size (length or width) of each of the plurality of Mini-LED chips 6 on the blue membrane 5 is 50-200 μm. The specific size can be adjusted according to the actual situation.

In an embodiment of the present disclosure, the thickness of the blue membrane 5 is 70-75 μm. The specific thickness can be adjusted according to actual conditions.

Embodiment 2

Figure 5:
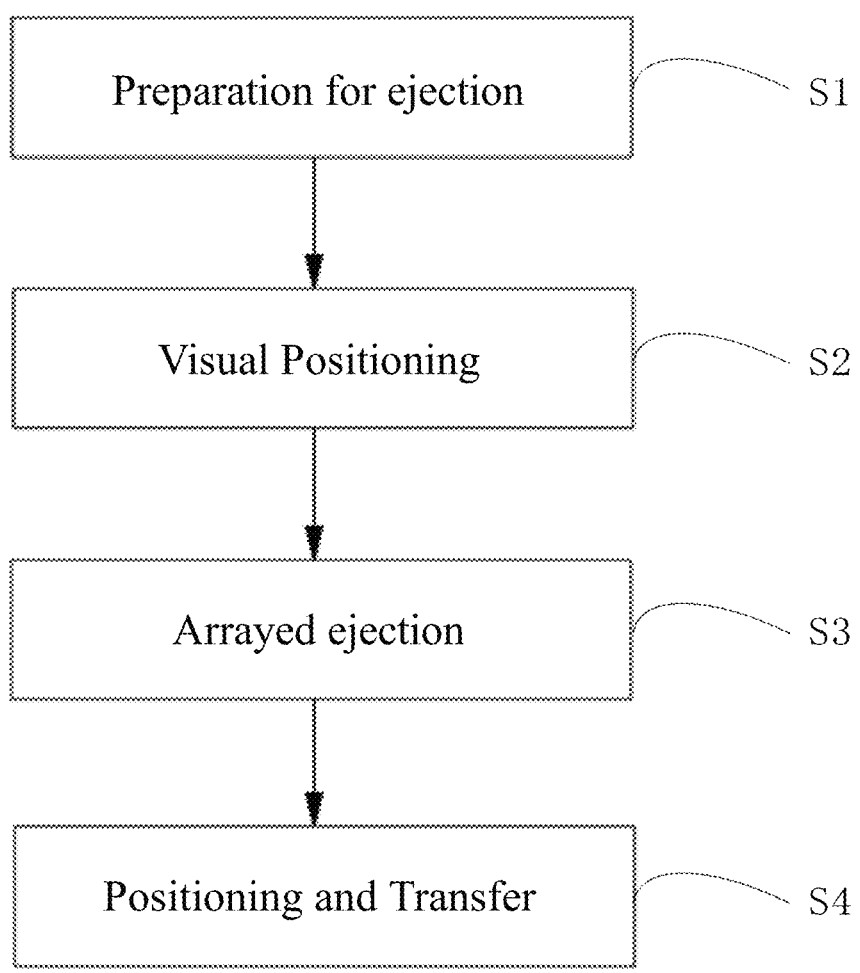
FIG. 5 is a flow chart of a method for mass transfer of Mini-LEDs based on the array water jet-based ejection according to an embodiment of the present disclosure.

FIG. 5 is a flowchart of a method for mass transfer of the Mini-LEDs based on array water jet-based ejection according to an embodiment of the present disclosure, in which the device described in any of the above embodiments is used. The method includes the following steps.

(S1) Preparation for Ejection

The blue membrane 5 is horizontally placed on the Z-axis motion platform 3, and the transfer substrate 7 is fixed on the side of the operation platform 8 near the blue membrane 5. The plurality of Mini-LED chips 6 are bonded to a lower surface of the blue membrane 5.

(S2) Visual Positioning

The plurality of Mini-LED chips 6 are scanned by the vision camera 2 through the blue membrane 5 with a certain degree of transparency to obtain the pose information of the plurality of Mini-LED chips 6, and the water jet channel 9 is controlled for fine adjustment based on the pose information of the plurality of Mini-LED chips 6. The vision camera 2 identifies the blue membrane 5, the array water jet-type ejection unit 4, and the distance between the blue membrane 5 and the transfer substrate 7 to adjust the height of the Z-axis motion platform 3, the position of the planar motion platform 1 in the X-axis and Y-axis directions, the position of the transfer substrate 7 in the Y-axis direction and the position of the operation platform 8 in the Y-axis direction to complete the positioning of the array water jet-type ejection unit 4, the plurality of Mini-LED chips 6 and the transfer substrate 7 in the X-axis direction and the Y-axis direction.

(S3) Arrayed Ejection

A water jet array is ejected by the array water jet-type ejection unit 4 to drive a first group of Mini-LED chips 6 and the blue membrane 5 to be peeled off to the transfer substrate 7.

In this embodiment, the impact of the water jet array causes the blue membrane 5 and the Mini-LED chips 6 below blue membrane 5 to fall. During the falling process, the blue membrane 5 deforms, and the adhesive layer between the blue membrane 5 and the Mini-LED chips 6 gradually tears from the edges of the Mini-LED chips 6.

When the Mini-LED chips 6 contact the transfer substrate 7 below, the Mini-LED chips 6 are detached from the blue membrane 5 due to the adhesive force of the double-sided adhesive tape on the glass substrate or the solder paste on the PCB substrate.

(S4) Positioning and Transfer

The array water jet-type ejection unit 4 is transferred a position above a second group of Mini-LED chips among the plurality of Mini-LED chips, through positioning of the vision camera, and repeating step (S3) to complete ejection of the plurality of Mini-LED chips.

Compared to the traditional ejection methods, the array water jet-based ejection method effectively reduces the impact on the blue membrane and Mini-LED chips, and avoids the downward pin ejection process in the mechanical pin-ejector transfer technique, allowing a higher transfer yield and an improved transfer efficiency. The arrayed ejection ensures that the Mini-LED chips of the same group have the same ejection transfer conditions, reducing the probability of pose deviations during the chip transfer compared to traditional ejection methods. Additionally, the water jet channel can be finely adjusted to address transfer errors caused by pose deviations of the chips on the blue membrane.

The present disclosure has been described in detail above with reference to accompanying drawings and embodiments. It should be noted that the disclosed embodiments are merely exemplary, and are not limited to limit the present disclosure. Those skilled in the art can still make various changes, modifications and replacements to technical features recited in the above embodiments. It should be understood that those changes, modifications and replacements made without departing from the spirit of the disclosure shall fall within the scope of the disclosure defined by the appended claims.

What is claimed is:

1. A device for mass transfer of mini light-emitting diodes (Mini-LEDs) based on array water jet-based ejection, comprising:
    a planar motion platform operating on an X-Y plane;
    a vision camera;
    an array water jet-type ejection unit;
    a Z-axis motion platform;
    a blue membrane;
    an operation platform; and
    a transfer substrate;
    wherein the vision camera and the array water jet-type ejection unit are provided on a side of the planar motion platform;
    the array water jet-type ejection unit comprises a water jet channel and a through-hole array;
    the Z-axis motion platform is provided at the side of the planar motion platform where the vision camera is provided, and is spaced from the planar motion platform; and the Z-axis motion platform is configured for placement of the blue membrane;
    a plurality of Mini-LED chips uniformly distributed are bonded to a surface of the blue membrane;
    the operation platform is spacedly provided at a side of the Z-axis motion platform away from the planar motion platform; and
    the transfer substrate is fixedly provided on a side of the operation platform near the Z-axis motion platform.

2. The device of claim 1, wherein the transfer substrate is a glass substrate or a printed circuit board (PCB) substrate.

3. The device of claim 2, wherein in a case where the transfer substrate is the glass substrate, a surface of a side of the transfer substrate near the blue membrane is provided with a double-sided adhesive tape; and
    in a case where the transfer substrate is the PCB substrate, the surface of the side of the transfer substrate near the blue membrane is provided with a solder paste.

4. The device of claim 1, wherein a spacing between adjacent through-holes in the through-hole array is a positive integer multiple of a spacing between adjacent Mini-LED chips among the plurality of Mini-LED chips.

5. The device of claim 1, wherein a diameter of individual through-holes in the through-hole array is less than or equal to a length of a shortest side of each of the plurality of Mini-LED chips in contact with the surface of the blue membrane.

6. The device of claim 1, wherein a geometric size of each of the plurality of Mini-LED chips is 50-200 μm.

7. The device of claim 1, wherein a thickness of the blue membrane is 70-75 μm.

\* \* \* \* \*